United States Patent
Chen

(10) Patent No.: US 10,609,824 B2
(45) Date of Patent: Mar. 31, 2020

(54) MANUFACTURING METHOD OF A MULTI-LAYER CIRCUIT BOARD

(71) Applicant: Winbond Electronics Corp., Taichung (TW)

(72) Inventor: Yu-Ming Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/660,832

(22) Filed: Oct. 23, 2019

(65) Prior Publication Data

US 2020/0053884 A1 Feb. 13, 2020

Related U.S. Application Data

(62) Division of application No. 15/658,420, filed on Jul. 25, 2017, now Pat. No. 10,499,512.

(30) Foreign Application Priority Data

Dec. 6, 2016 (CN) .......................... 2016 1 1107853

(51) Int. Cl.
*H05K 3/02* (2006.01)
*H05K 3/10* (2006.01)
(Continued)

(52) U.S. Cl.
CPC ............ *H05K 3/4614* (2013.01); *B33Y 80/00* (2014.12); *H05K 1/0306* (2013.01); *H05K 1/111* (2013.01);
(Continued)

(58) Field of Classification Search
CPC .. H05K 3/4614; H05K 3/4664; H05K 3/4629; H05K 3/12; H05K 1/0306; H05K 1/111; H05K 1/115; H05K 1/14; H05K 3/0014; H05K 3/403; H05K 2201/09045; B33Y 80/00; Y10T 29/49128; Y10T 29/49155; Y10T 29/49165
(Continued)

(56) References Cited

U.S. PATENT DOCUMENTS 5,245,135 A * 9/1993 Schreiber ............. H05K 3/4007
29/831
6,166,333 A * 12/2000 Crumly ............... H01L 21/4846
29/846
(Continued)

FOREIGN PATENT DOCUMENTS

CN 103327741 9/2013

OTHER PUBLICATIONS

"Office Action of China Counterpart Application," dated Nov. 5, 2019, p. 1-p. 8.

*Primary Examiner* — Donghai D Nguyen
(74) *Attorney, Agent, or Firm* — JCIPRNET

(57) ABSTRACT

A multi-layer circuit board including a plurality of insulation bumps, a first conductive layer, and a second conductive layer is provided. The plurality of insulation bumps are disposed between a first substrate and a second substrate. A top portion of the plurality of insulation bumps is served as a circuit connection point. The first conductive layer is disposed on the first substrate and connected to the circuit connection point. The second conductive layer is disposed on the second substrate and connected to the circuit connection point.

5 Claims, 6 Drawing Sheets

(51) Int. Cl.
*H05K 3/46* (2006.01)
*B33Y 80/00* (2015.01)
*H05K 1/14* (2006.01)
*H05K 1/11* (2006.01)
*H05K 3/12* (2006.01)
*H05K 3/00* (2006.01)
*H05K 1/03* (2006.01)
*H05K 3/40* (2006.01)

(52) U.S. Cl.
CPC .............. *H05K 1/115* (2013.01); *H05K 1/14* (2013.01); *H05K 3/0014* (2013.01); *H05K 3/12* (2013.01); *H05K 3/4629* (2013.01); *H05K 3/4664* (2013.01); *H05K 3/403* (2013.01); *H05K 2201/09045* (2013.01); *Y10T 29/49155* (2015.01)

(58) Field of Classification Search
USPC .......................................... 29/831, 846, 852
See application file for complete search history.

(56) References Cited

U.S. PATENT DOCUMENTS

| | | | |
|---|---|---|---|
| 6,897,568 B2 * | 5/2005 | Haimerl | H01L 24/10 257/779 |
| 7,592,244 B2 * | 9/2009 | Kurosawa | H01L 23/3114 228/180.22 |
| 2006/0223303 A1 | 10/2006 | Kurosawa | |
| 2014/0284767 A1 | 9/2014 | Yamazaki | |

* cited by examiner

MANUFACTURING METHOD OF A MULTI-LAYER CIRCUIT BOARD

CROSS-REFERENCE TO RELATED APPLICATION

This application is a divisional of and claims priority benefit of U.S. patent application Ser. No. 15/658,420, filed on Jul. 25, 2017, now U.S. patent Ser. No. 10/499,512, which claims the priority benefit of China application serial no. 201611107853.0, filed on Dec. 6, 2016. The entirety of each of the above-mentioned patent applications is hereby incorporated by reference herein and made a part of this specification.

BACKGROUND OF THE INVENTION

Field of the Invention

The invention relates to a circuit board, and particularly relates to a multi-layer circuit board using a 3D printing technique and a manufacturing method thereof.

Description of Related Art

To achieve high-density circuit design and high density circuit interlayer interconnection, it is necessary to reduce circuit using space occupied by vias in a normal circuit board. A manufacturing method of an interlayer interconnection technique commonly used for a high density interconnection (HDI) is a free stacked via structure which uses processes of laser drilling and metal hole filling to complete the electrical connection of the circuit interlayer. The method has disadvantages of complex process, high pollution post-treatment, and lower yield of final products. The buried bump interconnection technology (B2it) is to make a double sided board or a multi-layer board first. A conductive material is printed on a copper foil by multiple screen printing to form cone bumps. Then, a combined lamination process is used. That is, after placing an insulation sheet on conductive bumps, an insulation laminate board is pressed on the copper foil by a hot pressing method, and the conductive bumps penetrate the insulation sheet, so that the prefabricated conductive bumps can make electrical connections between the circuit interlayers.

However, in the B2it process, since a conductive paste used to fabricate the bumps has material properties of high viscosity and low thixotropic index (TI), only performing one time of printing on the conductive material is unable to reach the design height. It is required to repeat 4 to 5 times of the processes of printing and curing the conductive material, and thus the conductive bumps having the design height can be formed. Additionally, in the process that the bumps puncture the insulation laminate board to superimposed build-up layers, the conductive bumps are prone to skew, which will cause bad conductive connection of a printed circuit board (PCB), thereby reducing the production yield.

SUMMARY OF THE INVENTION

The invention provides a multi-layer circuit board using a non-metal material (ceramic material) to prefabricate bumps, so as to obtain better material properties and prevent the bumps from skewing in a pressing and puncturing process.

The invention provides a manufacturing method of a multi-layer circuit board using a 3D-printing technique. The bumps are printed by a ceramic-like material and a conductive circuit is printed on a substrate and the bumps by 3D functional printing, so as to fabricate a high density multi-layer circuit board.

The invention provides a multi-layer circuit board including a first substrate, a plurality of insulation bumps, a first conductive layer, a second substrate, and a second conductive layer. The plurality of insulation bumps are disposed on the first substrate, wherein a material of the insulation bumps is a ceramic-like material. The first conductive layer is disposed on the first substrate, and a portion of the first conductive layer is located at a top portion of the plurality of insulation bumps. The second substrate is disposed on the first substrate and has a plurality of openings respectively exposing the first conductive layer of the top portion of the plurality of insulation bumps. The second conductive layer is disposed on the second substrate, and the second conductive layer is electrically connected to the first conductive layer of the top portion of the plurality of insulation bumps.

The invention provides a multi-layer circuit board including a plurality of insulation bumps, a first conductive layer, and a second conductive layer. The plurality of insulation bumps are disposed between a first substrate and a second substrate. A top portion of the plurality of insulation bumps is served as a circuit connection point, wherein a material of the insulation bumps is a ceramic-like material. The first conductive layer is disposed on the first substrate and connected to the circuit connection point. The second conductive layer is disposed on the second substrate and connected to the circuit connection point.

The invention provides a manufacturing method of a multi-layer circuit board including the following steps. A plurality of insulation bumps with a protruding shape are formed on a first substrate, wherein the plurality of insulation bumps includes being formed by a 3D printing method, and a material of the insulation bumps is a ceramic-like material. A first conductive layer is formed on the first substrate, and a portion of the first conductive layer is located at a top portion of the plurality of insulation bumps. An adhesive layer is formed on a second substrate. The first substrate and the second substrate are pressed. The insulation bumps penetrate the adhesive layer and the second substrate and expose the top portion. A second conductive layer is formed on the second substrate, and the second conductive layer is electrically connected to the first conductive layer of the top portion of the plurality of insulation bumps. The first conductive layer and the second conductive layer include being formed by a 3D printing method.

Based on the above, the invention utilizes a 3D printing technique that the bumps are printed by the ceramic-like material and the conductive circuit are printed on the board and the bumps by 3D functional printing, so as to fabricate the high density multi-layer circuit board. The process can be simplified and the material can be effectively used. In addition, better material properties can be obtained due to using the non-metal material to prefabricate the bumps, so as to prevent the bumps from skewing in the pressing and puncturing process. Additionally, printing the conductive wires not only can reduce material consumption effectively, but also can provide a green process method to reduce the pollution of the environment.

In order to make the aforementioned features and advantages of the disclosure more comprehensible, embodiments accompanied with figures are described in detail below.

DESCRIPTION OF THE EMBODIMENTS

Figure 1A:
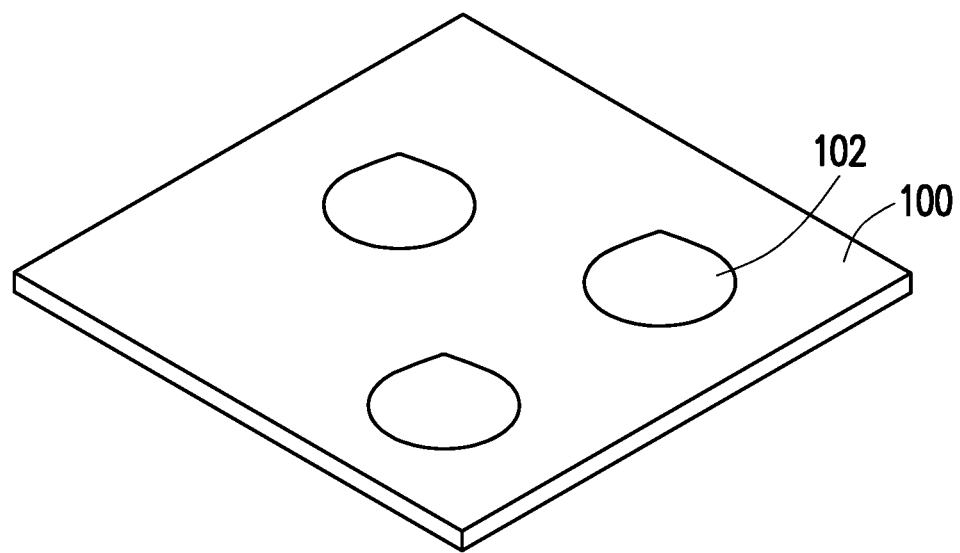
FIG. 1A to FIG. 1G are schematic diagrams of a manufacturing method of a multi-layer circuit board according to an embodiment of the invention.

Referring to FIG. 1A, a substrate 100 is provided first. The substrate 100 includes an insulating substrate, and a material thereof is a resin, for example. Then, a plurality of insulation bumps 102 are formed on the substrate 100. A hardness of the insulation bump is larger than that of silver, for example. That is, the hardness of the insulation bump is larger than Mohs hardness of 2.7, for example. A material of the insulation bump 102 includes a ceramic-like material, such as zirconium oxide, aluminum oxide, silicon dioxide, titanium dioxide, silicon nitride, silicon carbide, or a combination thereof. The insulation bumps 102 are formed by a 3D printing method, for example. The ceramic-like material powder is printed to a bump shape by a 3D printing technique. Additionally, after forming the plurality of insulation bumps 102 using the 3D printing technique, a sintering process may be performed to sinter the ceramic-like powder to a ceramic body. In an embodiment, the plurality of insulation bumps 102 include being formed using a stencil printing method. Also, the fabrication of the insulation bumps can be completed at one time using the 3D printing technique. Compared to the conventional use of the stencil printing technique, it is possible to save the cost of multiple repeating processes to complete the insulation bumps.

Figure 1B:
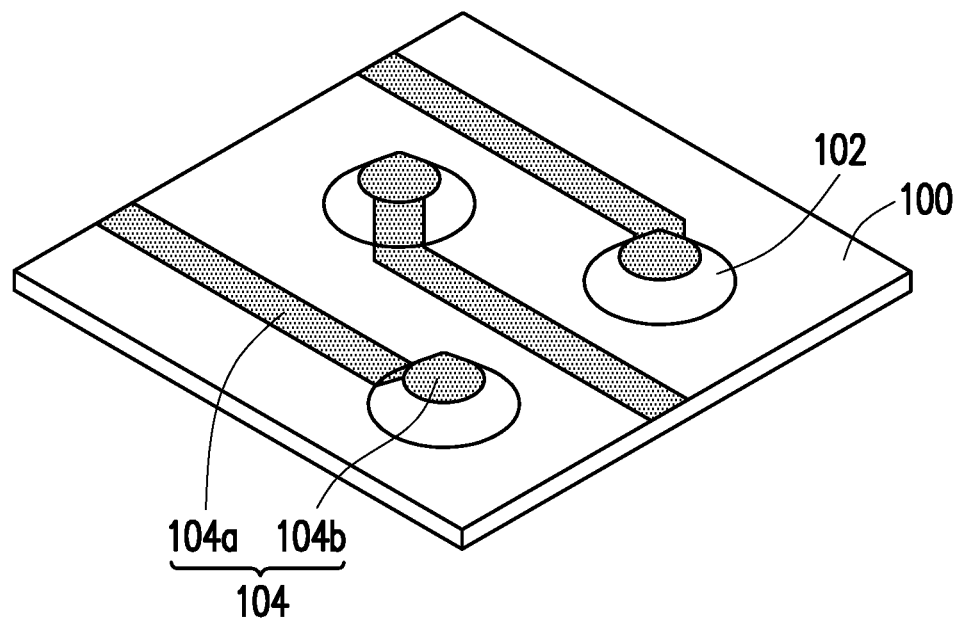

Referring to FIG. 1B, a conductive layer 104 is formed on the substrate 100. A portion of the conductive layer 104 is located at a top portion of the plurality of insulation bumps 102. The conductive layer 104 includes being formed by using a 3D printing method. A conductive wire circuit pattern (conductive layer 104) is printed on the substrate 100 and the plurality of insulation bumps 102 using the 3D printing technique. A material of the conductive layer 104 is gold, silver, copper, aluminum, or other metal, for example. The conductive layer 104 includes a plurality of conductive wires. The plurality of conductive wires are divided into an extension portion 104a and a connection portion 104b, for example. The extension portion 104a is disposed on the substrate 100, and the connection portion 104b is located at the top portion of the insulation bumps 102.

Figure 1C:
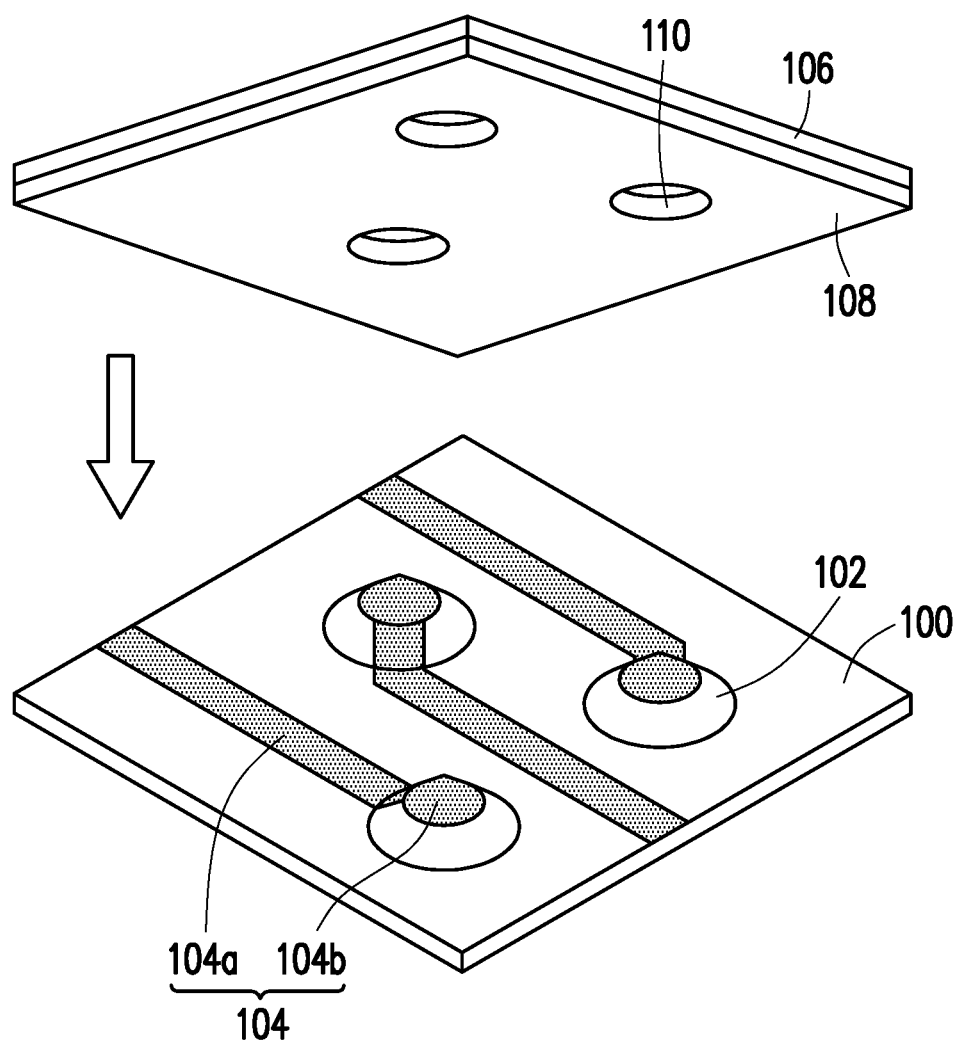

Referring to FIG. 1C, another substrate 106 is prepared, and an adhesive layer 108 is formed on the substrate 106. The substrate 106 includes an insulating substrate, and a material thereof is a resin, for example. The adhesive layer 108 is a hot pressing adhesive layer, for example. The adhesive layer 108 is formed on the substrate 106 by a lamination method, for example. In an embodiment, before or after laminating the adhesive layer 108 on the substrate 106, a plurality of openings 110 forming at the adhesive layer 108 is further included optionally. In an embodiment, in the step of forming the plurality of openings 110 at the adhesive layer 108, an opening may be formed on the substrate 106 simultaneously and optionally. A method of forming the plurality of openings 110 includes laser photolithography. The plurality of openings 110 are respectively formed corresponding to the plurality of insulation bumps 102 on the substrate 100. Forming the plurality of openings at the adhesive layer 108 can prevent overflow of the residual adhesive layer 108 when pressing the substrate 100 and the substrate 106 subsequently.

Figure 1D:
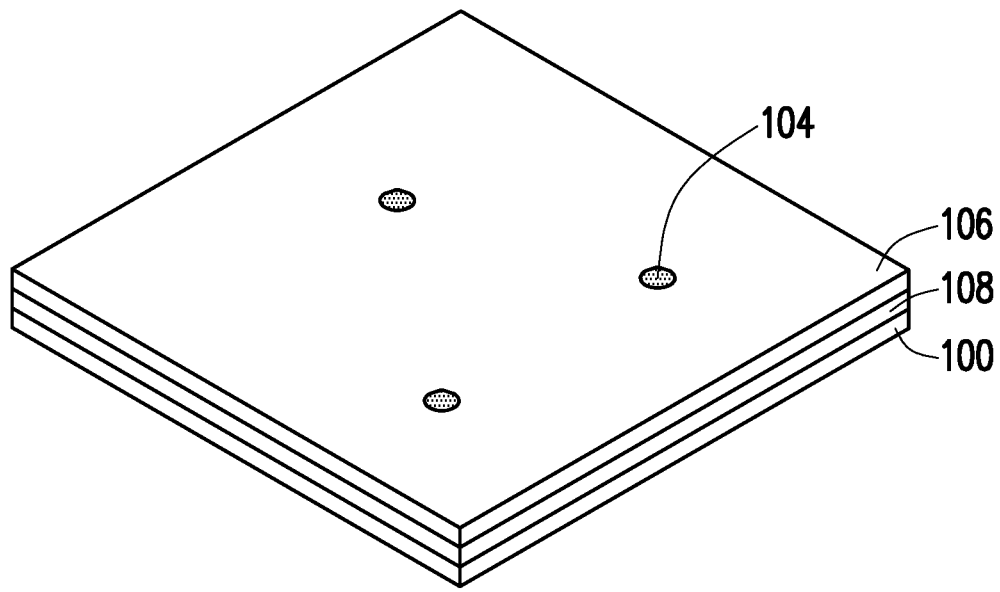

Referring to FIG. 1D, the substrate 100 and the substrate 106 are pressed, such that the plurality of insulation bumps 102 puncture the substrate 106 through the adhesive layer 108 to expose the top portion of the plurality of insulation bumps 102 formed with the conductive layer 104. A method of pressing the substrate 100 and the substrate 106 is a hot pressing method, for example. The substrate 106 (insulation laminate board) and the adhesive layer 108 cover on the substrate 100, which the circuit is completed, using a hot pressing method, and the insulation bumps 102 printed with the conductive wire circuit pattern (conductive layer 104) penetrates the substrate 106 thereon. That is, the insulation bumps 102 penetrate the adhesive layer 108 and the substrate 106 and expose the top portion.

Figure 1E:
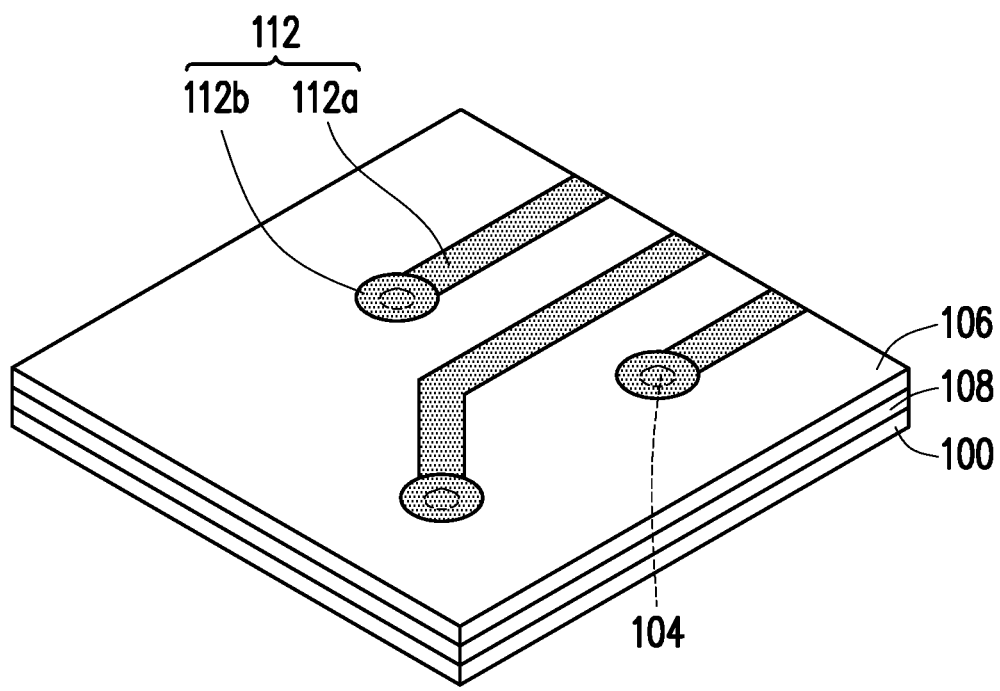

Referring to FIG. 1E, a conductive layer 112 is formed on the substrate 106, and the conductive layer 112 is electrically connected to the conductive layer 104 of the top portion of the plurality of insulation bumps 102. The conductive layer 112 includes being formed by a 3D printing method. The conductive layer 112 is formed on the substrate 106 and the conductive layer 104 exposed by the substrate 106 using the 3D printing technique. A material of the conductive layer 112 is gold, silver, copper, aluminum, or other metal, for example. The conductive layer 112 includes a plurality of conductive wires. The plurality of conductive wires are divided into an extension portion 112a and a connection portion 112b, for example. The extension portion 112a is disposed on the substrate 106, and the connection portion 112b is located at the top portion of the insulation bumps 102.

Figure 1F:
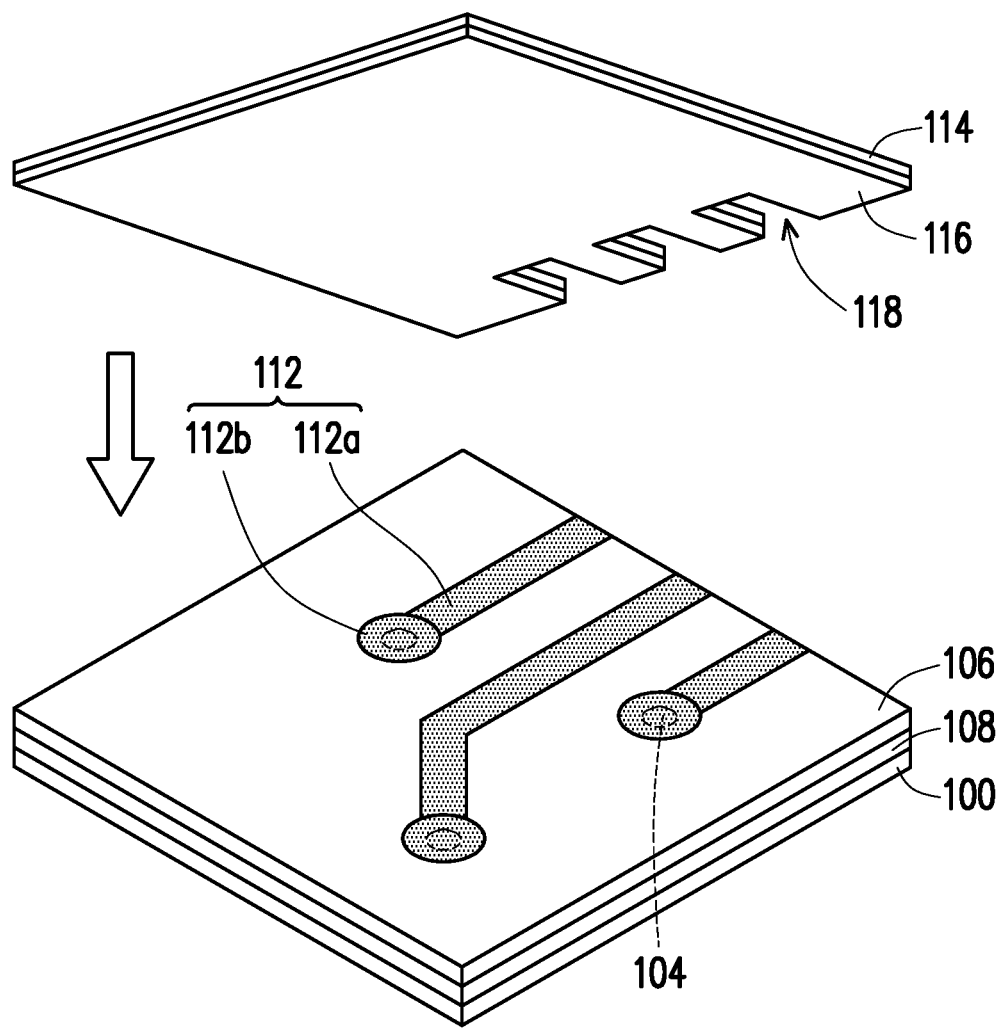

Referring to FIG. 1F, a protection board 114 is prepared, and an adhesive layer 116 is formed on the protection board 114. The protection board 114 includes an insulating substrate, and a material thereof is a resin, for example. The adhesive layer 116 is a hot pressing adhesive layer, for example. The adhesive layer 116 is formed on the protection board 114 by a lamination method, for example. After laminating the adhesive layer 116 on the protection board 114, a plurality of contact openings 118 forming at the protection board 114 is further included. A method of forming the plurality of contact openings 118 includes a laser perforation method.

Figure 1G:
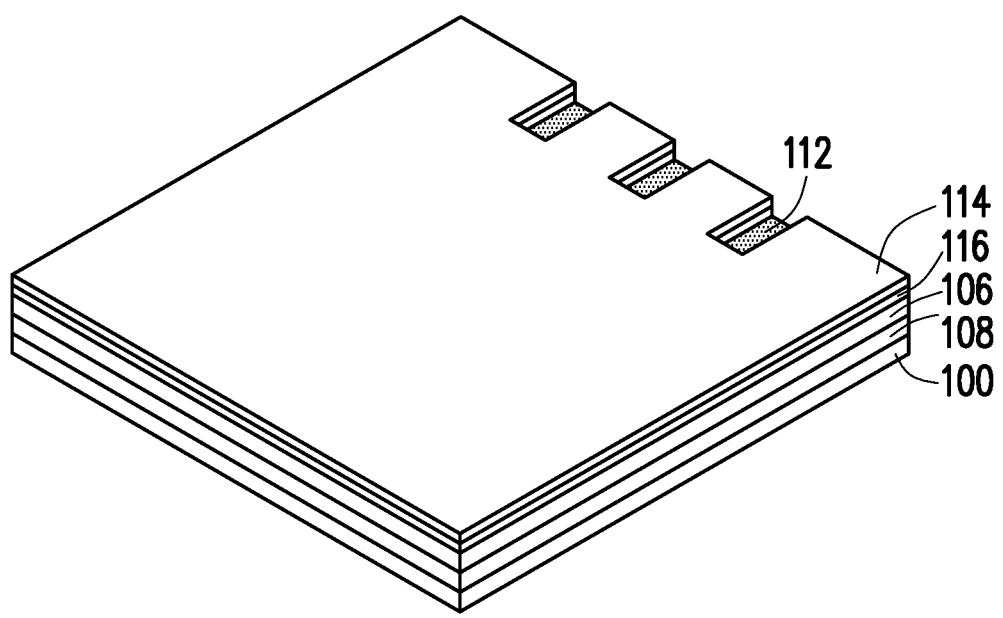

Referring to FIG. 1G, the protection board 114 is pressed on the substrate 106, wherein the contact openings 118 expose a portion of the conductive layer 112 on the substrate 106. A method of pressing the protection board 114 on the substrate 106 is a hot pressing method, for example.

In the aforementioned embodiments, the formation of two-layer circuit board is illustrated as an example. Certainly, the steps of forming the insulation bumps, printing the conductive pattern, and pressing the insulation laminate board may also be repeatedly performed on the substrate. After that, the protection board will be pressed on the substrate to form the two-layer or more circuit board.

Figure 2A:
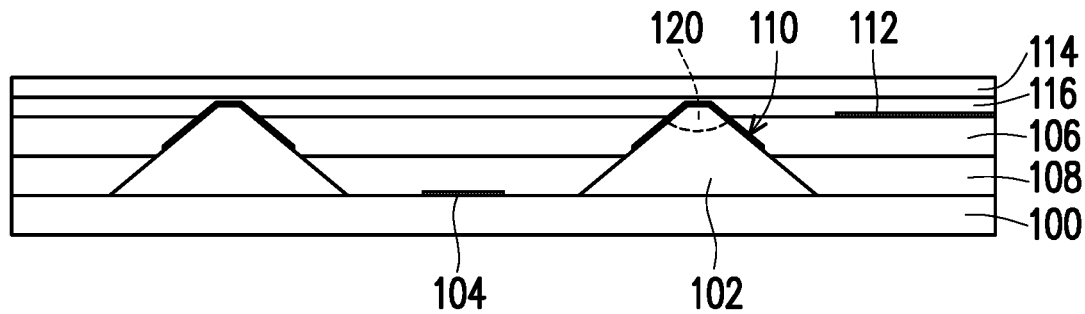
FIG. 2A and FIG. 2B are a schematic cross-sectional diagram and a three-dimensional circuit structure diagram of a multi-layer circuit board according to an embodiment of the invention.
Figure 2B:
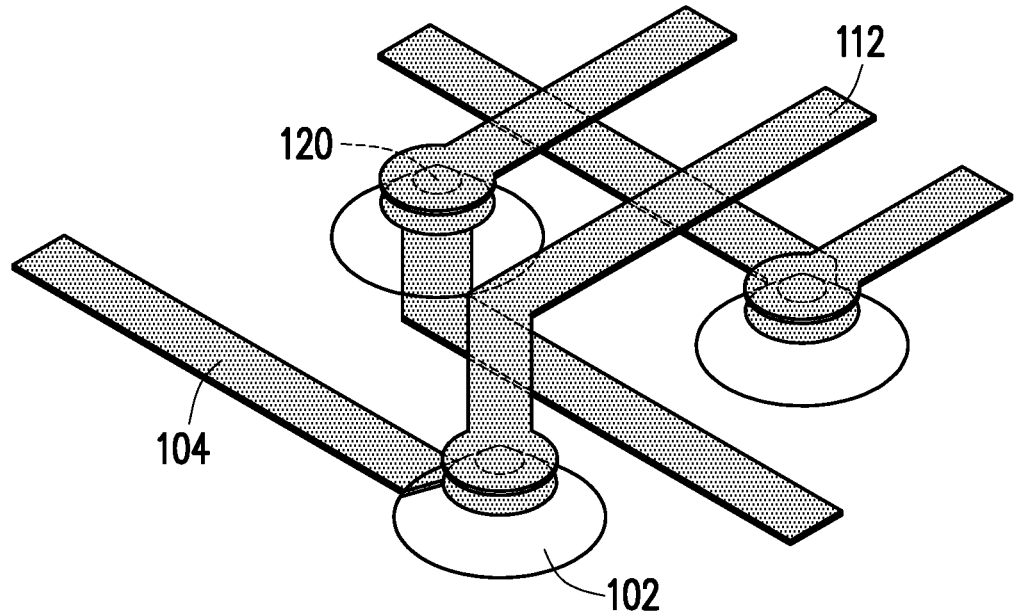

In FIG. 2A and FIG. 2B, the same reference numerals are used to denote the components the same as FIG. 1A to FIG. 1G, and the detailed illustration thereof is omitted.

As shown in FIG. 2A and FIG. 2B, the multi-layer circuit board of the invention includes the plurality of insulation bumps 102, the conductive layer 104, and the conductive layer 112. The top portion of the insulation bumps 102 is served as a circuit connection point 120 by the conductive layer 104 and the conductive layer 112.

For example, the plurality of insulation bumps 102 are disposed between the substrate 100 and the substrate 106. The top portion of the plurality of insulation bumps 102 is served as the circuit connection point 120. The conductive layer 104 is disposed on the substrate 100 and connected to the circuit connection point 120. The conductive layer 112 is disposed on the substrate 106 and connected to the circuit connection point 120.

The plurality of insulation bumps 102 are disposed on the substrate 100. wherein the material of the insulation bump 102 includes a ceramic-like material Since the ceramic-like material replaces the conductive metal to fabricate the bumps, the material properties thereof can be utilized to prevent the bumps from skewing in the pressing and puncturing process, so as to ensure the yield and the quality of the multi-layer circuit board.

The conductive layer 104 is disposed on the substrate 100, and a portion of the conductive layer 104 is located at the top portion of the plurality of insulation bumps 102. The substrate 106 is disposed on the substrate 100 and has the plurality of openings 110 respectively exposing the conductive layer 104 of the top portion of the plurality of insulation bumps 102.

The conductive layer 112 is disposed on the substrate 106. The conductive layer 112 is electrically connected to the conductive layer 104 of the top portion of the plurality of insulation bumps 102.

In an embodiment, the adhesive layer 108 is further included between the substrate 100 and the substrate 106. The adhesive layer 108 is a hot pressing adhesive layer, for example.

In an embodiment, the substrate 106 is further provided with the protection board 114 thereon. The adhesive layer 116 is further included between the protection board 114 and the substrate 106. The adhesive layer 116 is a hot pressing adhesive layer, for example.

In the multi-layer circuit board and the manufacturing method thereof of the invention, the 3D printing technique is used to print the ceramic-like material to fabricate the insulation bumps, and the 3D printing technique is used to print the conductive circuit (conductive layer), such that the circuit on the insulation bumps forms the conductive connection of the circuit interlayer, which replaces the commonly used via technique or the metal bumps in the B2it technique.

Also, the fabrication of the insulation bumps can be completed at one time using the 3D printing technique. It is required multiple repeating processes to complete the fabrication of the insulation bumps using the screen printing technique. By replacing the conductive metal by the ceramic-like material to fabricate the bumps, the material properties thereof can be utilized to prevent the bumps from skewing in the pressing and puncturing process, so as to ensure the yield and the quality of the multi-layer circuit board.

The 3D printing technique is used to replace a traditional etching process to complete the fabrication of the circuit board. Not only the production complexity and the required supplies of the multi-layer substrate can be effectively reduced, but also the manufacturing time and cost of the substrate can be effectively reduced.

In the multi-layer circuit board and the manufacturing method thereof of the invention, the conductive circuit is printed on the insulating substrate. Thus, the circuit layout can be easily changed depends on the use requirements which is very flexible in use.

Additionally, in the multi-layer circuit board and the manufacturing method thereof of the invention, the etching process and the electroplating process are not required, and thus it can provide a green process method to reduce the disposal cost of sewage and waste.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a multi-layer circuit board, comprising:
    forming a plurality of insulation bumps with a protruding shape on a first substrate, wherein the plurality of insulation bumps comprise being formed by a 3D printing method, and a material of the insulation bumps is a ceramic material;
    forming a first conductive layer on the first substrate, and a portion of the first conductive layer being located at a top portion of the plurality of insulation bumps;
    forming an adhesive layer on a second substrate;
    pressing the first substrate and the second substrate, the insulation bumps penetrating the adhesive layer and the second substrate and exposing the top portion; and
    forming a second conductive layer on the second substrate, and the second conductive layer being electrically connected to the first conductive layer of the top portion of the plurality of insulation bumps;
    wherein the first conductive layer and the second conductive layer comprise being formed by a 3D printing method.

2. The manufacturing method of the multi-layer circuit board according to claim 1, wherein after forming the plurality of insulation bumps by the 3D printing method, further comprising performing a sintering process.

3. The manufacturing method of the multi-layer circuit board according to claim 1, wherein after forming the adhesive layer on the second substrate and before pressing the first substrate and the second substrate, further comprising forming a plurality of openings on the adhesive layer.

4. The manufacturing method of the multi-layer circuit board according to claim 1, wherein pressing the first substrate and the second substrate comprises performing a hot pressing process.

5. The manufacturing method of the multi-layer circuit board according to claim 1, wherein the ceramic material is selected from a group consisting of zirconium oxide, aluminum oxide, silicon dioxide, titanium dioxide, silicon nitride, silicon carbide, and a combination thereof.

* * * * *